(12) United States Patent
Tabuchi et al.

(10) Patent No.: US 7,554,863 B2
(45) Date of Patent: Jun. 30, 2009

(54) VOLTAGE CONTROL CIRCUIT AND SEMICONDUCTOR DEVICE HAVING THE VOLTAGE CONTROL CIRCUIT

(75) Inventors: Motohiro Tabuchi, Tokyo (JP); Shinichi Miyatake, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 39 days.

(21) Appl. No.: 11/580,191

(22) Filed: Oct. 13, 2006

(65) Prior Publication Data

US 2007/0096958 A1 May 3, 2007

(30) Foreign Application Priority Data

Oct. 13, 2005 (JP) .............................. 2005-298976

(51) Int. Cl.
*G11C 7/00* (2006.01)
(52) U.S. Cl. .............................. 365/189.11; 365/230.06
(58) Field of Classification Search ............ 365/189.11, 365/230.06
See application file for complete search history.

(56) References Cited

U.S. PATENT DOCUMENTS

| | | | | |
|---|---|---|---|---|
| 5,282,171 | A * | 1/1994 | Tokami et al. ......... | 365/230.01 |
| 6,111,789 | A * | 8/2000 | Choi et al. ............. | 365/185.22 |
| 6,490,189 | B1 * | 12/2002 | Kang et al. ............ | 365/145 |
| 6,535,430 | B2 * | 3/2003 | Ogura et al. .......... | 365/185.23 |
| 7,184,358 | B2 * | 2/2007 | Kobayashi et al. ..... | 365/230.06 |

FOREIGN PATENT DOCUMENTS

| | | |
|---|---|---|
| JP | 10-214495 | 8/1998 |
| JP | 2001-243786 | 9/2001 |
| JP | 2002-367388 | 12/2002 |

* cited by examiner

*Primary Examiner*—Hoai V Ho
(74) *Attorney, Agent, or Firm*—Young & Thompson

(57) ABSTRACT

A voltage control circuit of the present invention is applicable to a combination of a decoder circuit and a level conversion circuit connected to the decoder circuit. The voltage control circuit includes a level conversion circuit voltage line for applying a voltage to the level conversion circuit, and a boost voltage connection switch for switching a voltage applied to the level conversion circuit voltage line according to an output signal from the decoder circuit. This configuration makes it possible to prevent, when a boost voltage is applied to the level conversion circuit, the breakdown of transistors in the level conversion circuit due to a ripple in the boost voltage.

11 Claims, 6 Drawing Sheets

US 7,554,863 B2

VOLTAGE CONTROL CIRCUIT AND SEMICONDUCTOR DEVICE HAVING THE VOLTAGE CONTROL CIRCUIT

This application claims priority to prior Japanese patent application JP 2005-298976, the disclosure of which is incorporated herein by reference.

BACKGROUND OF THE INVENTION

1. Technical Field

The present invention relates to a voltage control circuit, and in particular to a voltage control circuit for controlling a power supply voltage applied to a level conversion circuit and a semiconductor device having such voltage control circuit.

2. Related Art

Recent semiconductor devices are required to operate at higher speeds with a lower power supply voltage. In order to meet this requirement, a boost voltage is generated within a semiconductor device by boosting an externally applied power supply voltage, so that the power supply voltage and the boost voltage are selectively used as necessary. A level conversion circuit is used in the semiconductor device in order to enable the combination use of the power supply voltage and the boost voltage. The boost voltage is used, for example, in a word line drive circuit in a semiconductor storage device, a block selection circuit in a memory cell, and a transfer gate activation signal generating circuit. The boost voltage is mainly used as a gate signal of a transistor forming the transfer gate.

When the power supply voltage is used as a gate signal in the transfer gate, the level of the transmitted signal becomes lower than the power supply voltage by a threshold voltage of the transistor. Such decrease in the signal level will induce deterioration in the operation speed and the operation region of the semiconductor device. Therefore, the boost voltage is used for preventing the decrease in the signal level.

For example, a method is used in which a boost voltage boosted higher than the value of the externally applied power supply voltage by the threshold voltage value of the transistor or more is generated internally, and applied to the gate signal. When such boost voltage that has been boosted higher than the power supply voltage value by the threshold voltage value of the transistor or more is used as a gate input, the level of the signal transmitted from the transfer gate can be held at the power supply voltage level. In this manner, the use of the boost voltage makes it possible to prevent the decrease of the signal level, and to prevent the deterioration in the operation speed and the operation range of the semiconductor device.

A case of a word line drive circuit in a semiconductor device will be described as an example of circuits using a boost voltage. The word line drive circuit has a function to output a plurality of boost voltages, being formed of a plurality of decoder circuits receiving an address signal, and a plurality of level conversion circuits for level-converting a decoder output to a boost voltage.

FIG. 1 shows configuration of a conventional word line drive circuit, and FIG. 2 illustrates operational waveforms of the word line drive circuit of FIG. 1.

FIG. 1 shows n sets of decoder circuits 10-1 to 10-n and level conversion circuits 11-1 to 11-n associated with the respective decoder circuits. The decoder circuits operate at an externally applied power supply voltage VEXT, while the level conversion circuits operate at a boost voltage VPP. Hereafter, when the decoder circuits 10-1 to 10-n and the level conversion circuits 11-1 to 11-n are represented with any of the subscripts 1 to n, the subscript denotes the number of the set to which they belong. The decoder circuits and the level conversion circuits will be represented as the decoder circuit 10 and the level conversion circuit 11 without any subscript when the set number need not be specified. The same applies to decoder outputs Dec-1 to Dec-n and conversion circuit output signals Out-1 to Out-n, and they shall be represented simply as Dec and Out when the set number need not be specified.

The decoder circuits 10 receive a decoder selection signal (an address signal in this case), and output a decoder output Dec. As shown in FIG. 2, the decoder output Dec is at a low level when the decoder circuits 10 are not in use. When in use, only the decoder circuit selected by a decoder selection signal outputs a high level (indicated by the solid line in FIG. 2), whereas the other non-selected decoder circuits output a low level (indicated by the broken line in FIG. 2). The high level here is a power supply voltage VEXT. The level conversion circuits 11 receive a decoder output Dec from the decoder circuits 10 and output a conversion circuit output signal Out. The signal level of the decoder output Dec is a power supply voltage VEXT/ground voltage GND, and the signal level of the conversion circuit output signal Out becomes a boost voltage VPP/ground voltage GND. This means that the signal level (high level) is level-converted from the power supply voltage VEXT to the boost voltage VPP in the level conversion circuit 11.

Describing the level conversion circuits 11, the level conversion circuit 11-1 for example is formed of load transistors Q1 and Q3 connected between a boost voltage line at the boost voltage VPP and a line at the ground voltage GND, drive transistors Q2 and Q4, and an inverter circuit INV1. The drain, source, and gate of the load transistor Q1 are connected to the drain of the drive transistor Q2, the boost voltage VPP, and the drain of the drive transistor Q4, respectively. The drain, source, and gate of the drive transistor Q2 are connected to the drain of the load transistor Q1, the ground voltage GND, and the decoder output Dec-1, respectively.

The drain, source, and gate of the load transistor Q3 are connected to the drain of the drive transistor Q4, the boost voltage VPP, and the drain of the drive transistor Q2. The drain, source, and gate of the drive transistor Q4 are connected to the drain of the load transistor Q3, the ground voltage GND, and the output of an inverter circuit INV1 for inverting the decoder output Dec-1. A conversion circuit output signal Out-1 is output from the node to which the gate of the load transistor Q1 and the drains of the load transistor Q3 and drive transistor Q4 are connected.

The remaining level conversion circuits also have the same configuration as described above.

In the circuit configuration described above, the decoder output Dec and the conversion circuit output signal Out are at a logic of the same phase, and their signal level (high level) is converted from the power supply voltage VEXT to the boost voltage VPP.

However, the level conversion circuits 11 described above have problems in that they are prone to generate through current in the transistors and to induce gate breakdown. These problems are attributable to the fact that the level conversion circuits 11 are directly connected to the boost voltage line at the boost voltage VPP and constantly applied with a high voltage. The level conversion circuits 11 output a boost high level only when the decoder output Dec from a decoder circuit 10 selected by an address is a high level. On the other hand, the level conversion circuits 11 receiving a decoder output from the decoder circuits 10 which are not in use or not selected output a low level. Accordingly, the level conversion circuits 11 are left in such a stand-by state (low level output state) for most of the operating time of semiconductor device. Even during the low level output state, the level conversion circuits 11 are applied with the boost voltage VPP which is not used effectively.

The proportion of the level conversion circuits placed in the stand-by state becomes higher as the memory capacity becomes greater. The increase of the memory capacity increases the quantity of decoder circuits 10 to be arranged. When 256 (n=256) decoder circuits 10-1 to 10-256 are arranged, for example, one of the 256 decoder circuit is selected and only one level conversion circuit outputs a high level, while the remaining 255 conversion circuits output a low level. Even if the memory capacity is quadrupled, only one of the level conversion circuits outputs a high level, while the remaining 1023 level conversion circuits output a low level. In this manner, the majority of the level conversion circuits output a low level in the stand-by state.

A description will be made of stress applied to the level conversion circuits 11 when the level conversion circuits 11 output a low level and of a breakdown mode.

The level conversion circuits 11 are applied with the boost voltage VPP. The boost voltage VPP is boosted in a pump circuit (boost voltage generating circuit) (not shown) using capacity coupling, and is the highest power supply voltage in the semiconductor device chip. As described before, the boost voltage is used in various circuits such as the word line drive circuit, a block selection circuit in a memory cell, and a transfer gate activation signal generating circuit. Being used by the various circuits, the boost voltage is charged and discharged most acutely and repeatedly.

Therefore, the boost voltage VPP is caused to generate a large ripple Rp (FIG. 1) by the pumping operation of the boost voltage generating circuit. When the level conversion circuit 11 outputs a low level, the gate of the load transistor Q1 is at the ground voltage GND, while the source and the drain are at the boost voltage VPP. Accordingly, the channel region of the load transistor Q1 is also at the boost voltage VPP, and the boost voltage VPP is applied to an entire gate oxide film. When the ripple Rp occurs in the boost voltage VPP, the stress becomes higher by the voltage of the ripple Rp. The ripple Rp will deteriorate the gate oxide film of the load transistor Q1, which may result in increase of the leak current and occurrence of short-circuit Sh (FIG. 1) in the gate oxide film. Further, when the ripple occurs while the logic of the level conversion circuit is being shifted, through current it (FIG. 1) may occur in the level conversion circuit, resulting in breakdown of the load transistor Q1.

Methods of applying a power supply voltage to a level conversion circuit are described in the prior art documents as follows. Patent Publication 1 (Japanese Laid-Open Patent Publication No. H10-214495) discloses a nonvolatile semiconductor storage device having a voltage switch circuit for switching a power supply voltage applied to a drive circuit according to a command of delete, write or the like. Patent Publication 2 (Japanese Laid-Open Patent Publication No. 2001-243786) discloses applying a high voltage as a power supply voltage according to a command signal. When such high voltage is applied, a ramp-up period and a ramp-down period are set. Patent Publication 3 (Japanese Laid-Open Patent Publication No. 2002-367388) discloses applying a high voltage stepwise by the use of a delayed command when the high voltage is applied according to a command signal.

However, all these patent publications relate to a voltage switch circuit which switches a power supply voltage applied to a drive circuit according to a command of delete, write, or the like. In other words, none of Patent Publications 1 to 3 discloses switching the power supply voltage according to the selected or non-selected state of the decoder circuit.

As described above, in a semiconductor device having a plurality of level conversion circuits, the most of the level conversion circuits are in the stand-by state to output a low level, but nevertheless a boost voltage is applied also to these level conversion circuits in the stand-by state. Moreover, a ripple is more prone to occur in the boost voltage applied to these level conversion circuits. A ripple in the boost voltage may cause leakage of current or occurrence of short-circuit in the gate oxide films of transistors forming the level conversion circuits.

It is therefore an object of the present invention to provide a voltage control circuit which is capable of preventing the deterioration or breakdown of transistors due to a ripple in the boost voltage by controlling the power supply voltage applied to level conversion circuits according to an output from decoder circuits, and to provide a semiconductor device having such voltage control circuit.

SUMMARY OF THE INVENTION

In order to achieve the object described above, the present invention basically employs techniques described below. It is obvious that other techniques that can be modified in various manners without departing from the gist of the invention are also included in the present invention.

A voltage control circuit according to the present invention is connected to a combination of a decoder circuit and a level conversion circuit connected to the decoder circuit, and has a level conversion circuit voltage line for applying a voltage to the level conversion circuit, and a boost voltage connection switch for switching a voltage to the level conversion circuit voltage line according an output signal from the decoder circuit.

The voltage control circuit according to the present invention may be embodied in several aspects, In the voltage control circuit according to a first aspect, the boost voltage connection switch is connected between a boost voltage line for applying a boost voltage and the level conversion circuit voltage line. The boost voltage connection switch is placed in the low impedance state when the decoder circuit is in the selected state, whereas placed in the high impedance state when the decoder circuit is in the non-selected state or in the unused sate and connects between the boost voltage line and the level conversion circuit voltage line.

In the voltage control circuit according to the first aspect, preferably, the boost voltage connection switch is formed by a transistor, the gate of which is supplied with an inversion signal of an output signal from the decoder circuit.

In the voltage control circuit according to the first aspect, a power supply voltage is input to the gate of the transistor forming the boost voltage connection switch, whereby the boost voltage line and the level conversion circuit voltage line are connected with high impedance.

In the voltage control circuit according to a second aspect, the boost voltage connection switch is connected between a boost voltage line for applying a boost voltage and the level conversion circuit voltage line, connecting the boost voltage line and the level conversion circuit voltage line with low impedance when the decoder circuit is in the selected state, whereas not connecting them when the decoder circuit is in the non-selected state or in the unused state.

In the voltage control circuit according to the second aspect, preferably, the boost voltage connection switch is formed by a transistor, the gate of which is supplied with an inversion signal of an output signal from the decoder circuit.

In the voltage control circuit according to the second aspect, the boost voltage line is not connected to the level conversion circuit voltage line by inputting a boost voltage to the gate of the transistor forming the boost voltage connection switch.

The voltage control circuit according to the second aspect may further include an inverter circuit for inverting an output signal from the decoder circuit to output the inversion signal; and hold voltage connection switching means for applying a power supply voltage lower than the boost voltage to the level conversion circuit voltage line when the inversion signal is at a high level.

In the voltage control circuit according to a third aspect, a plurality of sets of the combination of the decoder circuit and the level conversion circuit may be prepared, so that the plurality of sets of the combination are divided into groups each composed of a plurality of the decoder circuits and a plurality of the level conversion circuits. In this case, the voltage control circuit is provided for each of the groups, and the level conversion circuit voltage line is connected in common to the plurality of level conversion circuits. The voltage control circuit further includes a logic circuit, and the logic circuit receives outputs from the plurality of decoder circuits. The voltage applied to the plurality of level conversion circuits is switched by inputting an output of the logic circuit to the boost voltage connection means.

In the voltage control circuit according to the third aspect, the logic circuit is preferably an NOR circuit.

The voltage control circuit according to the third aspect may further include hold voltage connection switching means for applying a power supply voltage lower than the boost voltage to the level conversion circuit voltage line when the NOR circuit outputs a high level.

The present invention further provides a semiconductor device having the voltage control circuit according to any of the first to third aspects.

The present invention further provides a semiconductor storage device including a main word decoder circuit and a sub-word decoder circuit, and the main word decoder circuit includes a voltage control circuit for switching a current drive capability of a boost voltage to be applied according to a selection signal designating an arranged memory cell region.

The present invention further provides a semiconductor storage device including a main word decoder circuit and a sub-word decoder circuit, and the sub-word decoder circuit includes a voltage control circuit for switching a current drive capability of a boost voltage to be applied according to a selection signal designating an arranged memory cell region.

The voltage control circuit according to the present invention switches a voltage applied to the level conversion circuit voltage line according to an output signal from the decoder circuit. When the decoder circuit is not in use or not selected, the voltage control circuit connects the level conversion circuit voltage line and the boost voltage line with high impedance or shuts off the connection to protect the level conversion circuit from a ripple in the boost voltage.

DESCRIPTION OF THE PREFERRED EMBODIMENTS

First Embodiment

Figure 3:
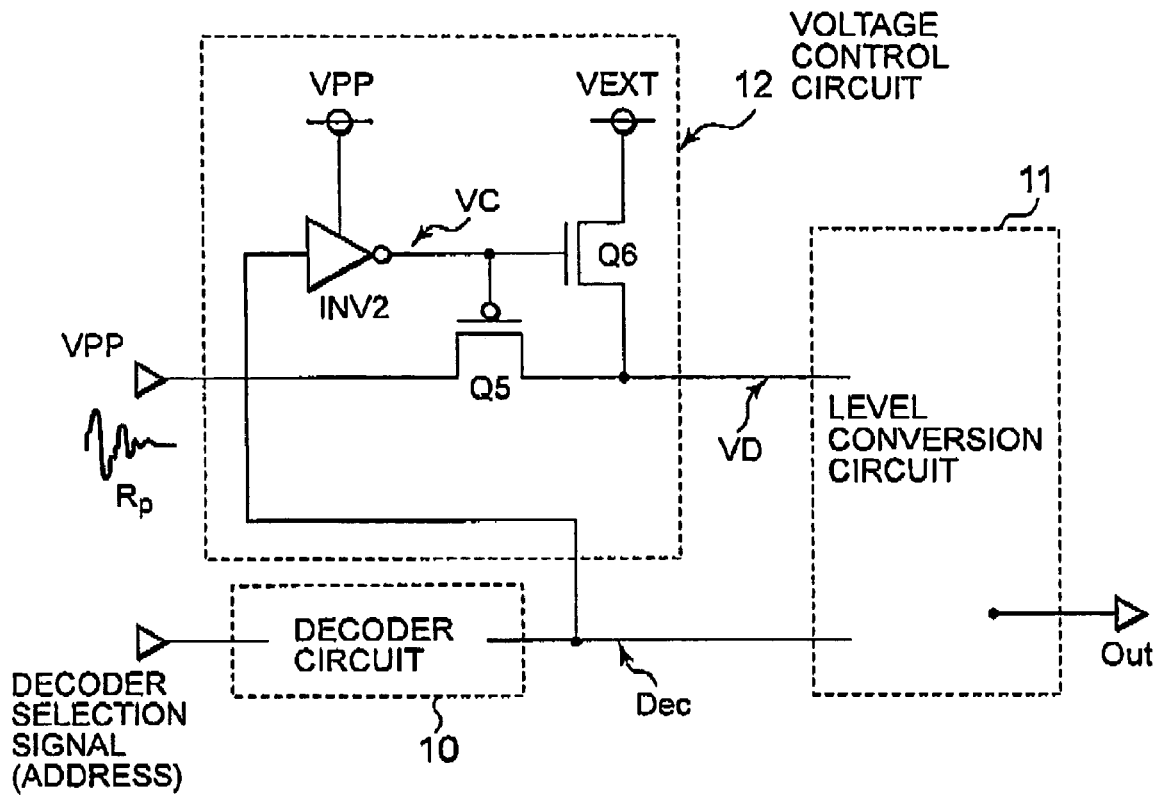
FIG. 3 is a diagram illustrating a voltage control circuit according to a first embodiment of the present invention.
Figure 4:
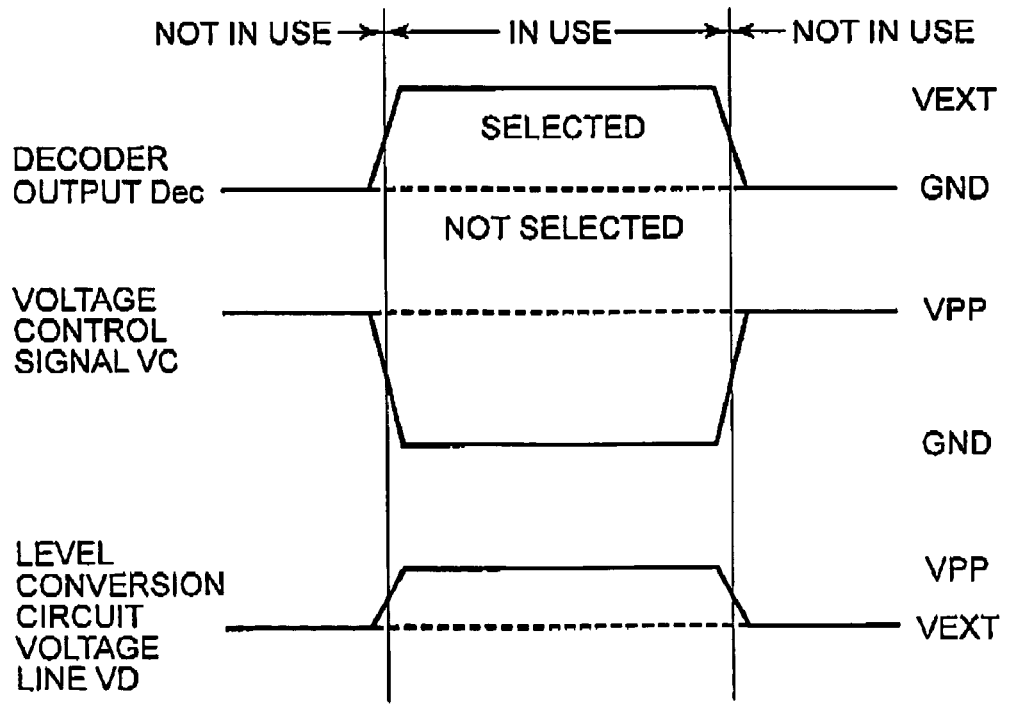
FIG. 4 is a diagram illustrating operational waveforms of the voltage control circuit shown in FIG. 3.

A first embodiment of the present invention will be described with reference to FIGS. 3 to 5. FIG. 3 illustrates basic configuration of a voltage control circuit used in a word line drive circuit, and FIG. 4 is an operational waveform diagram thereof.

Figure 1:
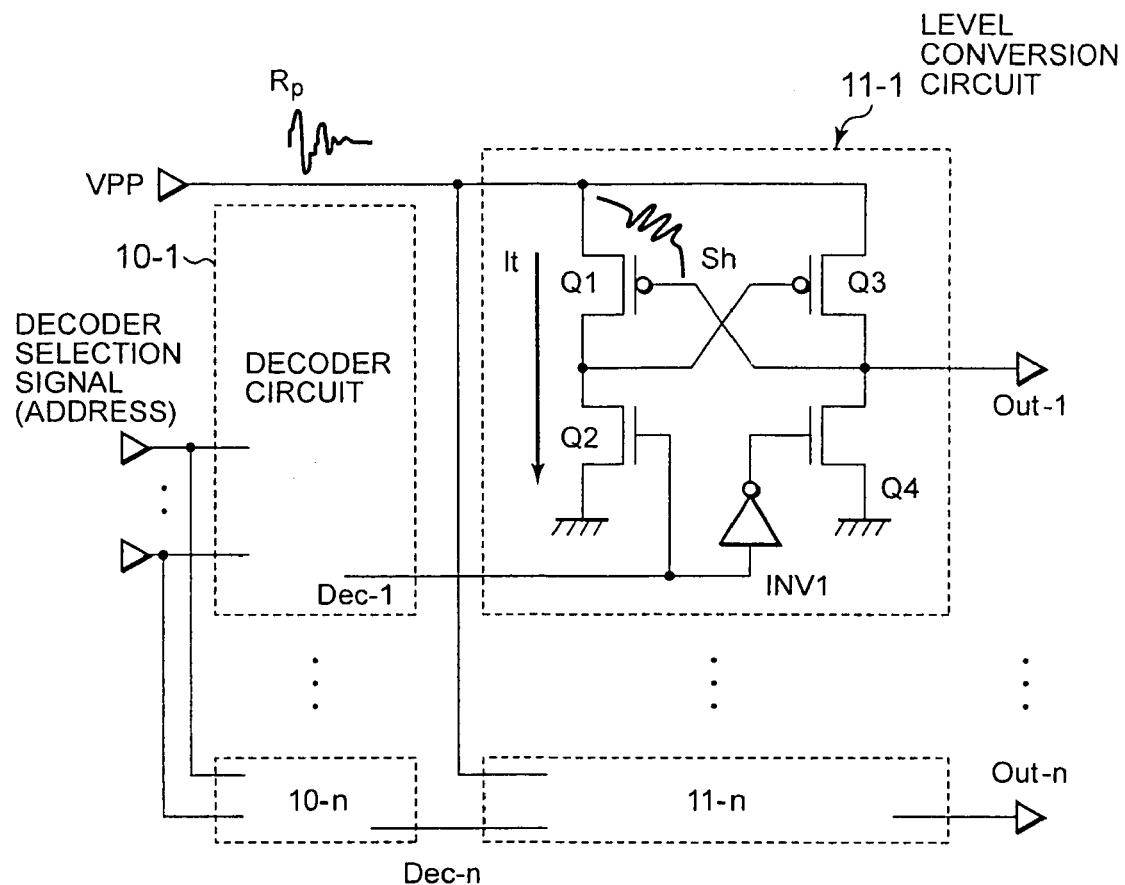
FIG. 1 is a diagram illustrating a voltage control circuit according to a prior art.
Figure 2:
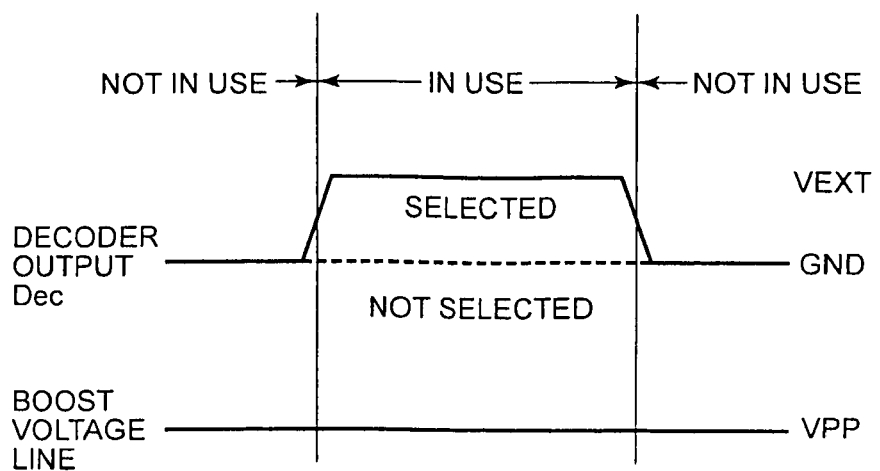
FIG. 2 is a diagram illustrating operational waveforms of the voltage control circuit shown in FIG. 1.

The word line drive circuit to which the present invention is applied is formed by adding a voltage control circuit to the word line drive circuit described in FIG. 1. As described in FIG. 1, the word line drive circuit is composed of a plurality of decoder circuits and level conversion circuits. FIG. 3 however only shows one decoder circuit 10 and one level conversion circuit 11 for the sake of convenience. Since operation and functions of these circuits are similar to those described in FIG. 1, detailed description thereof will be omitted.

As shown in FIG. 3, a voltage control circuit 12 according to the first embodiment is composed of an inverter circuit INV2, a transistor (PMOS transistor) Q5, and a transistor (NMOS transistor) Q6. The voltage control circuit 12 is provided for each combination of a decoder circuit and a level conversion circuit. The inverter circuit INV2 is applied with a boost voltage VPP as a power supply voltage. The inverter circuit INV2 receives a decoder output Dec from the decoder circuit 10 and outputs a voltage control signal VC to the gates of the transistors Q5 and Q6. The transistor Q5 serves as boost voltage connection switching means, and the source and the drain thereof are connected to the boost voltage VPP applied through a boost voltage line, and a level conversion circuit voltage line VD, respectively. The transistor Q6 serves as hold voltage connection switching means, and the drain and the source thereof are connected to a power supply voltage VEXT and the level conversion circuit voltage line VD, respectively.

Operation of the voltage control circuit 12 will be described, additionally referring to the operational waveforms in FIG. 4.

When the decoder circuits 10 are not in use, the decoder outputs Dec have a low level. In this case, the inverter circuit INV2 outputs a high-level boost voltage VPP as the voltage control signal VC. Since the voltage control signal VC is the boost voltage VPP, the transistor Q5 functioning as the boost voltage connection switching means becomes the OFF state, whereby the application of the boost voltage VPP to the level conversion circuit voltage line VD is stopped. On the other hand, the transistor Q6 functioning as the hold voltage connection switching means is in the ON state, and the power supply voltage VEXT is applied to the level conversion circuit voltage line VD. In this manner, the power supply voltage VEXT is applied from the voltage control circuit 12 to the level conversion circuit voltage line VD when the decoder circuit 10 is not in use.

When the decoder circuits are in use, the decoder output Dec of only one selected decoder circuit has a high level. The inverter circuit INV2 receiving this high-level output outputs a low-level voltage control signal VC. When the voltage control signal VC is at a low level, the transistor Q5 is in the ON state, and the boost voltage VPP is applied to the level conversion circuit voltage line VD. On the other hand, the transistor Q6 is in the OFF state, and the application of the power supply voltage VEXT to the level conversion circuit voltage line VD is stopped. When a decoder circuit 10 is selected in this manner, the boost voltage VPP is applied from the voltage control circuit 12 to the level conversion circuit voltage line VD.

Even if the decoder circuits are in use, all the decoder outputs Dec of the remaining unselected decoder circuits have a low-level, and hence the power supply voltage VEXT is applied to the level conversion circuit voltage line VD in the same manner as when the decoder circuits are not in use. In this manner, the power supply voltage VEXT is applied from the voltage control circuit to the level conversion circuit voltage line VD when the decoder circuit is not selected.

The boost voltage VPP is applied to the level conversion circuit voltage line VD connected to a selected decoder circuit as shown by the solid line in FIG. 4, whereas the power supply voltage VEXT is applied to the level conversion circuit voltage line VD connected to unselected decoder circuits as shown by the broken line in FIG. 4. The power supply voltage VEXT is applied to the level conversion circuit voltage line VD as shown by the broken line in FIG. 4, also when the decoder circuits are not in use. This means that, the voltage control circuit is capable of switching and controlling the power supply voltage applied to the level conversion circuit voltage line VD according the level of an output from the decoder circuits.

The voltage control circuit shown in FIG. 3 is capable of switching and controlling the application of the power supply voltage to the level conversion circuit according to an output from the decoder circuits. This eliminates the risk that the transistors of the level conversion circuit are broken due to the occurrence of a ripple in the boost voltage VPP. Instead however, there arises a risk that the transistor of the inverter circuit INV2 applied with the boost voltage VPP will be broken.

Figure 5:
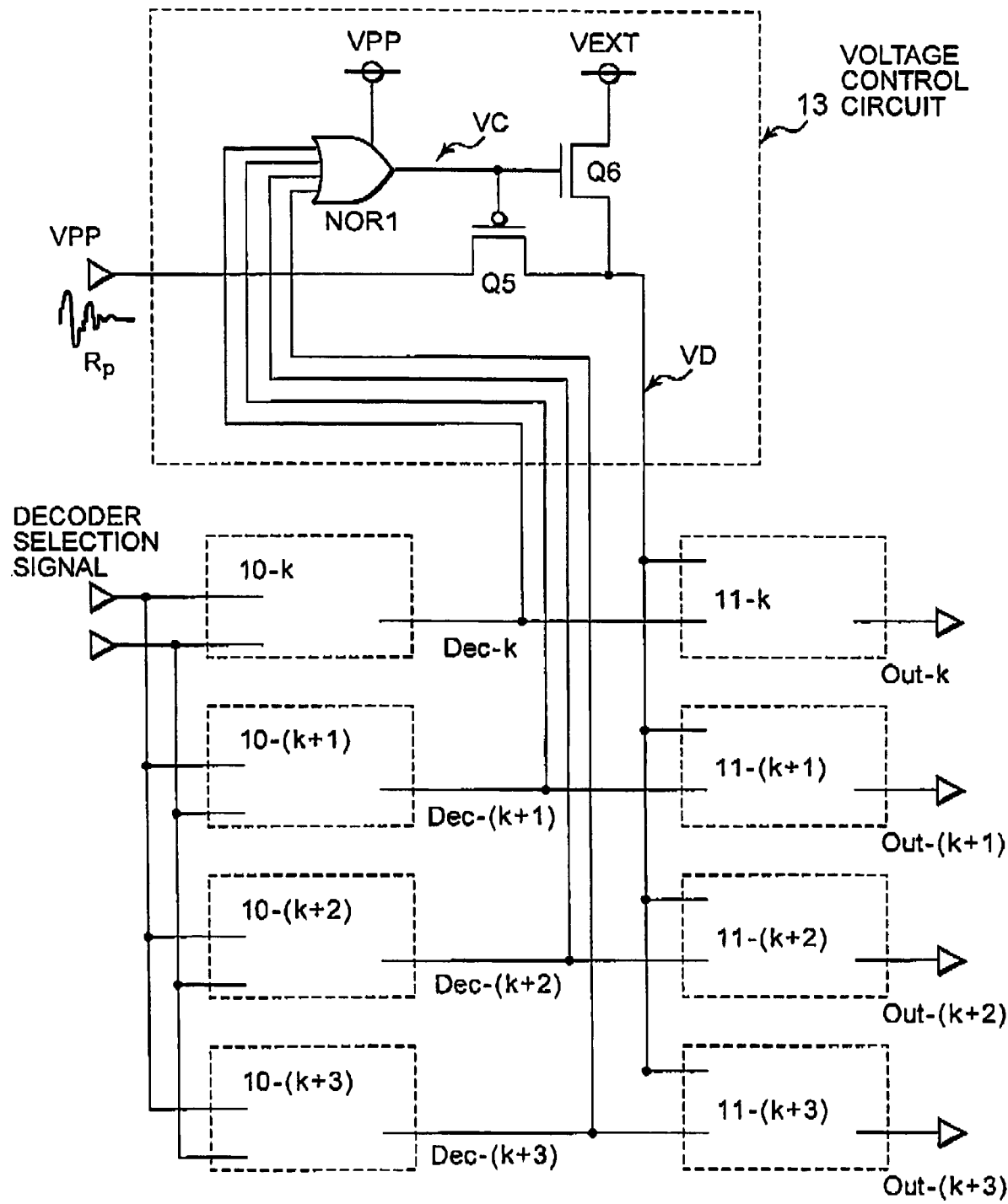
FIG. 5 is a diagram illustrating a voltage control circuit as a modification example of the first embodiment of the present invention.

FIG. 5 shows configuration of a voltage control circuit as a modification example of the voltage control circuit shown in FIG. 3.

In the word line drive circuit of FIG. 5, each group is formed by four of the n decoder circuits 10-1 to 10-n and four of the n level conversion circuits 11-1 to 11-n. A voltage control circuit 13 in FIG. 5 is composed of a four-input NOR circuit NOR1, and transistors Q5 and Q6. In FIG. 3, the voltage control circuit 12 is provided for each combination of a decoder circuit and a level conversion circuit. In FIG. 5, however, one voltage control circuit 13 is provided for each group of four decoder circuits and four level conversion circuits.

In FIG. 5, four decoder circuits and four level conversion circuits in each group are identified by assigning subscripts k, (k+1), (k+2), and (k+3) to the respective circuits. An NOR circuit NOR1 in the voltage control circuit 13 receives decoder outputs Dec-k, Dec-(k+1), Dec-(k+2), and Dec-(k+3) from the four decoder circuits 10-*k*, 10-(*k*+1), 10-(*k*+2), and 10-(*k*+3). The NOR circuit NOR1 outputs a voltage control signal VC to the gates of transistors Q5 and Q6. The transistor Q5 serving as boost voltage connection switching means has its source connected to the boost voltage VPP of the boost voltage line and its drain connected to the level conversion circuit voltage line VD. The transistor Q6 serving as hold voltage connection switching means has its drain connected to the power supply voltage VEXT and its source connected to the level conversion circuit voltage line VD.

Accordingly, the level conversion circuit voltage line VD to the four level conversion circuits 11-*k*, 11-(*k*+1), 11-(*k*+2), and 11-(*k*+3) in each group is applied with a common power supply voltage from the voltage control circuit 13. The four level conversion circuits 11-*k*, 11-(*k*+1), 11-(*k*+2), and 11-(*k*+3) are applied with the power supply voltage from the voltage control circuit 13 through a common level conversion circuit voltage line VD and receive output signals from the respective corresponding decoder circuits. The level conversion circuits 11-*k*, 11-(*k*+1), 11-(*k*+2), and 11-(*k*+3) thus output conversion circuit outputs Out-k, Out-(k+1), Out-(k+2), and Out-(k+3), respectively.

Referring also to the operational waveforms in FIG. 4 again, operation of the voltage control circuit 13 will be described.

When the decoder circuits are not in use, all the decoder outputs Dec are at a low level. The NOR circuit NOR1 is applied with a boost voltage VPP as the power supply, and the NOR circuit NOR1 outputs a high-level boost voltage VPP as a voltage control signal VC. Since the voltage control signal VC is the boost voltage VPP, the transistor Q5 as the boost voltage connection switching means becomes the OFF state, and the application of the boost voltage VPP to the level conversion circuit voltage line VD is stopped. On the other hand, the transistor Q6 serving as the hold voltage connection switching means is in the ON state, and the four level conversion circuits 11-*k* to 11-(*k*+3) in each group are applied with a power supply voltage VEXT from the level conversion circuit voltage line VD. Further, since all the decoder outputs input to the four level conversion circuits are at a low level, all these level conversion circuits output a low level. In this manner, when the decoder circuits are not in use, the power supply voltage VEXT is applied to the level conversion circuit voltage line VD from the voltage control circuit 13.

When the decoder circuits are in use, only one selected decoder output Dec has a high level. In this example, it is assumed that the decoder circuit 10-*k* outputs a high level while the remaining decoder circuits output a low level. Receiving this high level, the NOR circuit NOR1 outputs a low-level voltage control signal VC. When the voltage control signal VC is at a low level, the transistor Q5 serving as the boost voltage connection switching means is in the ON state, and the boost voltage VPP is applied to the level conversion circuit voltage line VD. On the other hand, the transistor Q6 serving as the hold voltage connection switching means is in the OFF state, and the application of the power supply voltage VEXT to the level conversion circuit voltage line VD is stopped.

In this manner, when there is a selected decoder circuit in the group, the boost voltage VPP is applied to the four level conversion circuits 11-*k* to 11-(*k*+3) in the group by the voltage control circuit 13. The level conversion circuit 11-*k* outputs a high level since the received decoder output Dec-k is at a high level. Since the remaining decoder outputs are at a low level, the remaining level conversion circuits 11-(*k*+1), 11-(*k*+2), and 11-(*k*+3) output a low level. In this manner, when one of the decoder circuits in each group is selected, the boost voltage VPP is applied to the four level conversion circuits in the group from the voltage control circuit 13.

In contrast, when the decoder circuits are in use and none of the four decoder circuits 10-*k* to 10-(*k*+3) is selected, the NOR circuit NOR1 outputs a high-level voltage control signal VC. In this case, the transistor Q5 becomes the OFF state, and the application of the boost voltage VPP to the level conversion circuit voltage line VD is stopped. On the other hand, the transistor Q6 becomes the ON state, and the power supply voltage VEXT is applied to the four level conversion circuits 11-$k$ to 11-($k$+3). Since all the received decoder outputs are at a low level, all the level conversion circuits in the group output a low level. In this manner, when none of the decoder circuits in a group is selected, the power supply voltage VEXT is applied to the four level conversion circuits in the group from the voltage control circuit 13.

As described above, FIG. 5 shows the configuration in which each four decoder circuits are combined into a group and the decoder outputs therefrom are input into one NOR circuit. When the decoder circuits are not in use, all the decoder outputs Dec have a low level, and the voltage control signal VC becomes a high level. Accordingly, all the level conversion circuits are applied with the power supply voltage VEXT. When the decoder circuits are in use and one of the decoders combined into a group is selected, the level conversion circuits in the group are applied with the boost voltage VPP. When none of the decoders in the group is selected, the level conversion circuits in the group are applied with the power supply voltage VEXT.

In FIG. 3, the power supply voltage applied to the level conversion circuit voltage line VD is switched according to individual decoder outputs. In FIG. 5, however, the decoder circuits and the level conversion circuits are combined into groups, and the power supply voltage applied to the level conversion circuit voltage line VD is switched for each group. Therefore, each group has one NOR circuit having the boost voltage VPP as power supply. This substantially reduces the quantity of transistors which may be broken due to a ripple in the boost voltage.

When the number of the decoder circuits is n=256 and each four decoder circuits are combined into one group in the configuration shown in FIG. 5, for example, the number of the NOR circuits applied with the boost voltage VPP is 256/4=64, and the number of the level conversion circuits applied with the boost voltage is 4, the total being 68. Accordingly, the number of circuits applied with the boost voltage VPP is reduced to about ¼ of the conventional one. The number of the decoder circuits to be combined into each group is not particularly limited. When each eight decoder circuits are combined into a group, the number of the NOR circuits applied with the boost voltage VPP is 256/8=32, and the number of the level conversion circuits applied with the boost voltage VPP is 8, the total being 40. In this manner, the increase in the number of the decoder circuits and the level conversion circuits combined into a group substantially reduces the number of circuits applied with the boost voltage VPP, hence reducing the rate of occurrence of breakdown due to a ripple in the boost voltage. As a result, the reliability of the semiconductor device can be improved.

According to the present embodiment, the transistor Q6 is provided as the hold voltage connection switching means. The transistor Q6 applies to the level conversion circuits the power supply voltage VEXT instead of the boost voltage VPP as the power supply voltage, when the decoder circuits output a low level. However, since the decoder output Dec that is an input signal to the level conversion circuits is fixed, the transistor Q6 may be omitted. In the case where the transistor Q6 is provided to hold the power supply voltage to the level conversion circuits at the power supply voltage VEXT, the speed of the level conversion circuits returning to the boost voltage VPP is increased, and an effect can be expected that the load on the boost voltage generating circuit will be reduced.

The voltage control circuit according to the present embodiment includes boost voltage connection switching means for applying the boost voltage to the level conversion circuits when the decoder circuit is selected, and stopping the application of the boost voltage to the level conversion circuits when not selected. Thus, the risk of the level conversion circuits being affected by a ripple in the boost voltage is eliminated by the boost voltage connection switching means stopping the application of the boost voltage to the level conversion circuits when no decoder circuit is selected. This makes it possible to obtain a voltage control circuit that is free of the influence of a ripple in the boost voltage, and a highly reliable semiconductor device having such voltage control circuit.

Second Embodiment

Figure 6:
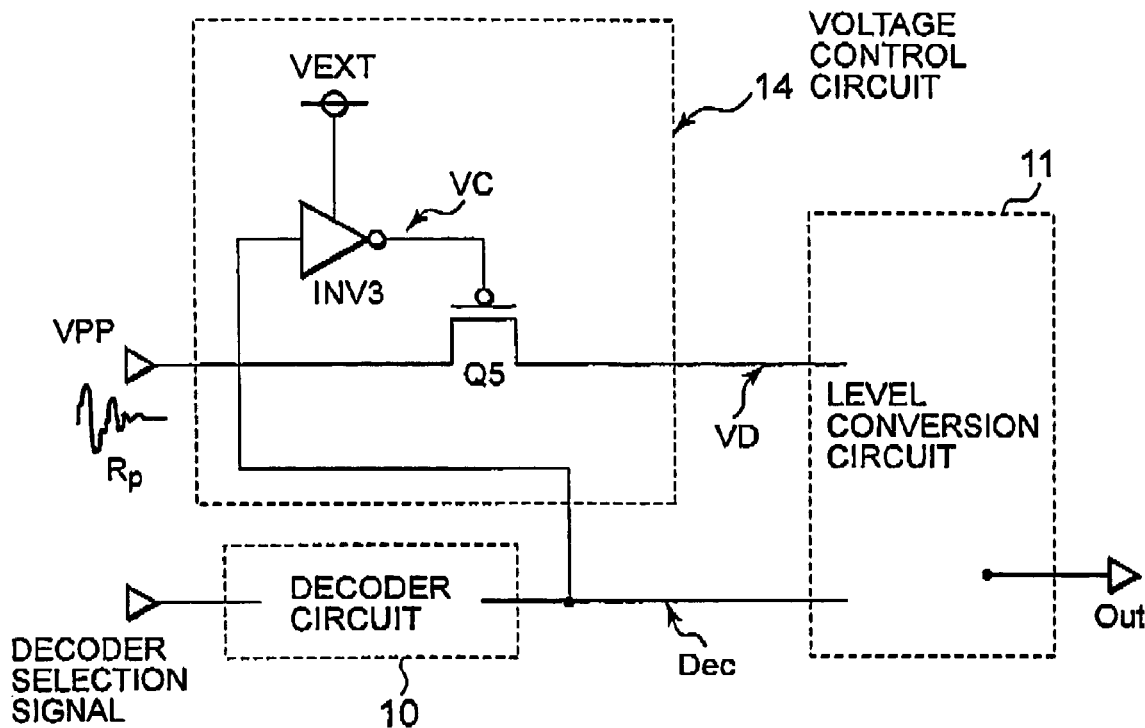
FIG. 6 is a diagram illustrating a voltage control circuit according to a second embodiment of the present invention.
Figure 7:
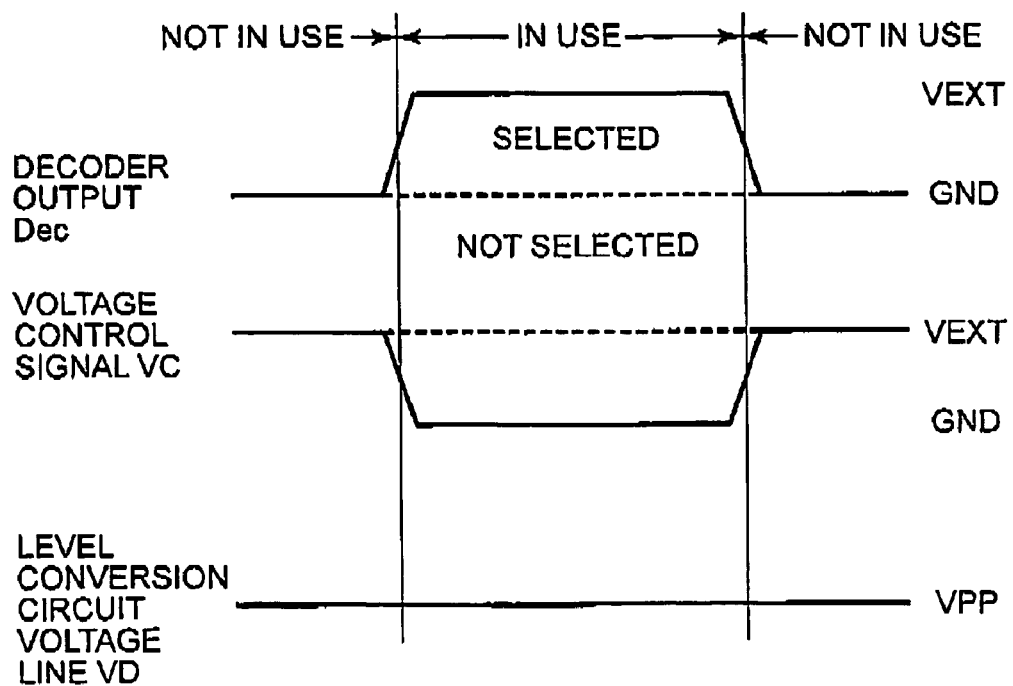
FIG. 7 is a diagram illustrating operational waveforms of the voltage control circuit shown in FIG. 6.

Referring to FIGS. 6 and 7, a second embodiment of the present invention will be described. FIG. 6 shows a voltage control circuit according to the second embodiment, and FIG. 7 shows operational waveforms of the voltage control circuit.

In the word line drive circuit according to the second embodiment, the transistor Q6 is omitted from the voltage control circuit 12 shown in FIG. 3. The word line drive circuit is composed of a decoder circuit 10, a level conversion circuit 11, and a voltage control circuit 14. The voltage control circuit 14 is composed of an inverter circuit INV3 and a transistor Q5 serving as boost voltage connection switching means. The inverter circuit INV3 is applied with a power supply voltage VEXT, receives a decoder output Dec from the decoder circuit 10, and outputs a voltage control signal VC. The drain, source, and gate of the transistor Q5 are connected to a level conversion circuit voltage line VD, a boost voltage line of the boost voltage VPP, and the voltage control signal VC, respectively. The voltage control circuit 14 is provided in associated with each combination of the decoder circuit 10 and the level conversion circuit 11. The configuration of the decoder circuit 10 and the level conversion circuit 11 is similar to the first embodiment. Therefore, like components are assigned with like reference numbers, and detailed illustration and description thereof are omitted.

The voltage control circuit 14 according to the second embodiment receives a low level from the decoder output Dec when the decoder circuits 10 are not in use. In this case, the inverter circuit INV3 outputs a high-level power supply voltage VEXT as the voltage control signal VC. In general, the boost voltage VPP is boosted to 1.2 to 1.5 times higher than the power supply voltage VEXT applied externally. Therefore, the difference between the boost voltage VPP and the power supply voltage VEXT is greater than the threshold voltage value of the transistor Q5. Accordingly, the transistor Q5 becomes the ON state. However, the current drive capability (or the current supply capability) thereof is much smaller in comparison with when the ground voltage is applied as the gate voltage, and the transistor Q5 assumes a high impedance state. This means that the level conversion circuit voltage line VD is connected to the boost voltage VPP of the boost voltage line in the high impedance state.

As described above, the transistor Q5 serving as the boost voltage connection switching means is placed in the high impedance state when the decoder circuits are not in use, so that the level conversion circuit voltage line VD is connected to the boost voltage VPP. Since the transistor Q5 is in the high impedance state, the level conversion circuit voltage line VD maintains the boost voltage VPP, and filters any noise occurring in the boost voltage VPP so that the noise is not transmitted onto the level conversion circuit voltage line VD. In this manner, the level conversion circuit voltage line VD is able to shut off the noise in the boost voltage while maintaining the boost voltage VPP, and hence is able to prevent the breakdown of the transistors during the stand-by state of the level conversion circuits 11.

When the decoder circuits 10 are in use, only one selected decoder output Dec has a high level (indicated by the solid line in FIG. 7). Receiving this high level, the inverter circuit INV3 outputs a low-level voltage control signal VC. Since the voltage control signal VC is a low level ground voltage GND, the transistor Q5 is in a low-impedance ON state, and the level conversion circuit voltage line VD is applied with the boost voltage VPP. When the decoder circuit is selected, as described above, the level conversion circuit voltage line VD is connected to the boost voltage VPP by the boost voltage connection switch in the low impedance state.

In contrast, when the decoder circuits 10 are in the used state and are not selected, the decoder output Dec has a low level (indicated by the broken line in FIG. 7). The inverter circuit INV3 outputs a high-level power supply voltage VEXT as the voltage control signal VC. Receiving the high-level power supply voltage VEXT, the boost voltage connection switching means becomes a high impedance state. The level conversion circuit voltage line VD is connected to the boost voltage VPP by the boost voltage connection switching means in the high impedance state. These operations are the same as when the decoder circuit is not in use, and the level conversion circuit voltage line VD is able to shut off the noise in the boost voltage VPP while maintaining the boost voltage VPP and thus is able to prevent the breakdown of the transistors during the stand-by state of the level conversion circuits 11.

As shown in FIG. 7, the level conversion circuit voltage line VD is constantly applied with the boost voltage VPP. The level conversion circuit connected to the selected decoder circuit is applied with the boost voltage VPP by the boost voltage connection switching means having in the low impedance state. In contrast, when the decoder circuits are in the unused and non-selected state, the level conversion circuits are applied with the boost voltage VPP by the boost voltage connection switching means in the high impedance state. Accordingly, the level conversion circuit connected to the selected decoder circuit is enabled to rapidly rise to a high level. In contrast, when connected to the decoder circuit not selected, the level conversion circuit is applied with the boost voltage VPP as the power supply, via a high impedance. As a result, a ripple in the boost voltage VPP is filtered by the high impedance, and the breakdown of the transistor can be prevented during the stand-by state of the level conversion circuit 11.

In the voltage control circuit according to the second embodiment, the boost voltage VPP is connected to the level conversion circuit connected to the selected decoder circuit by the boost voltage connection switching means at low impedance. The level conversion circuit connected to the decoder circuit in the unused or non-selected is applied with the boost voltage VPP by the boost voltage connection switching means at high impedance. Since the boost voltage connection switching means is at high impedance, any ripple occurring in the boost voltage is filtered, and the risk is eliminated that the level conversion circuit will be affected by the ripple in the boost voltage. This makes it possible to obtain a voltage control circuit that is free of the influence of a ripple in the boost voltage, and a highly reliable semiconductor device having such voltage control circuit.

Third Embodiment

Figure 8:
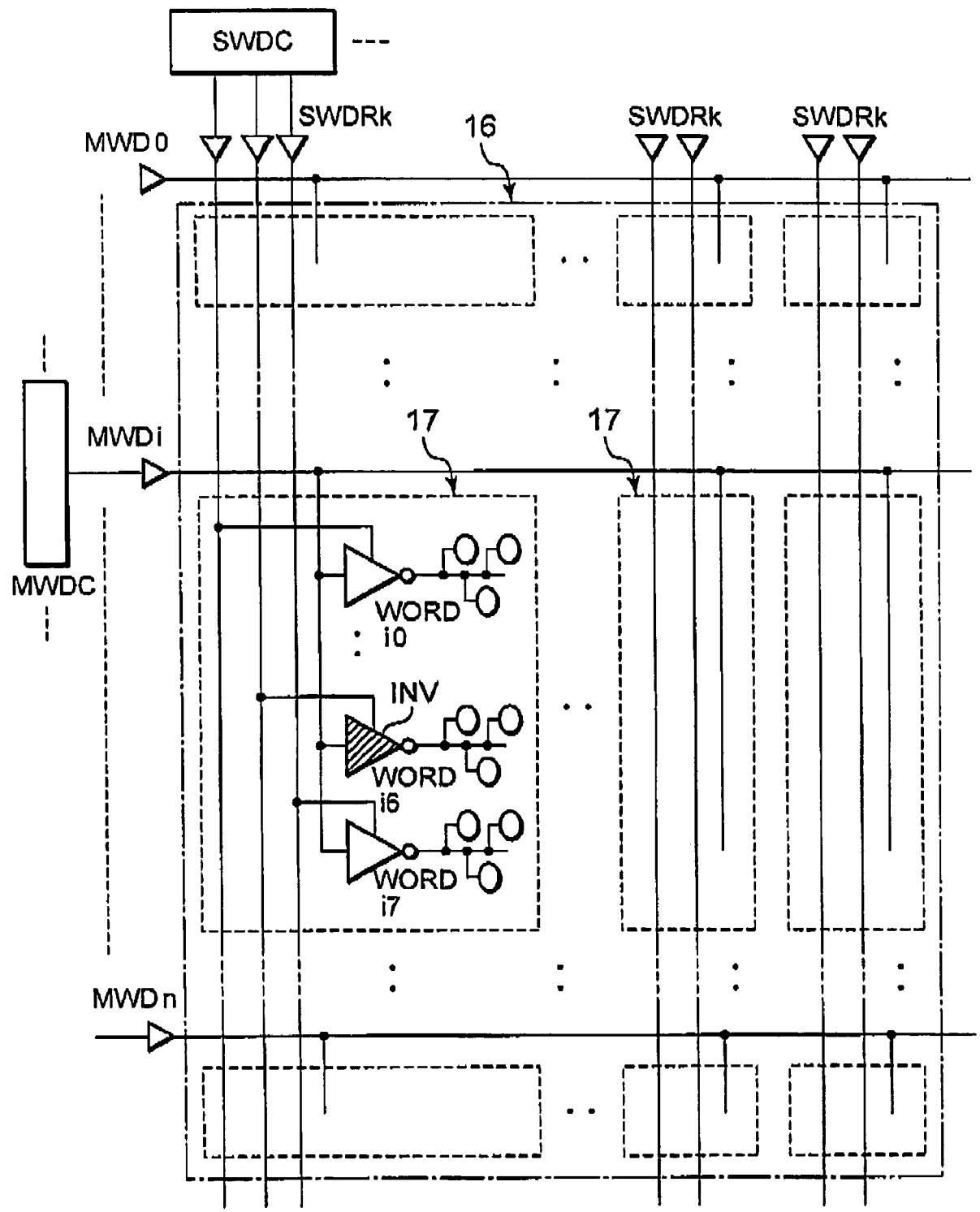
FIG. 8 is a schematic diagram for explaining selection of a word line in a cell array mat according to a third embodiment of the present invention.
Figure 9:
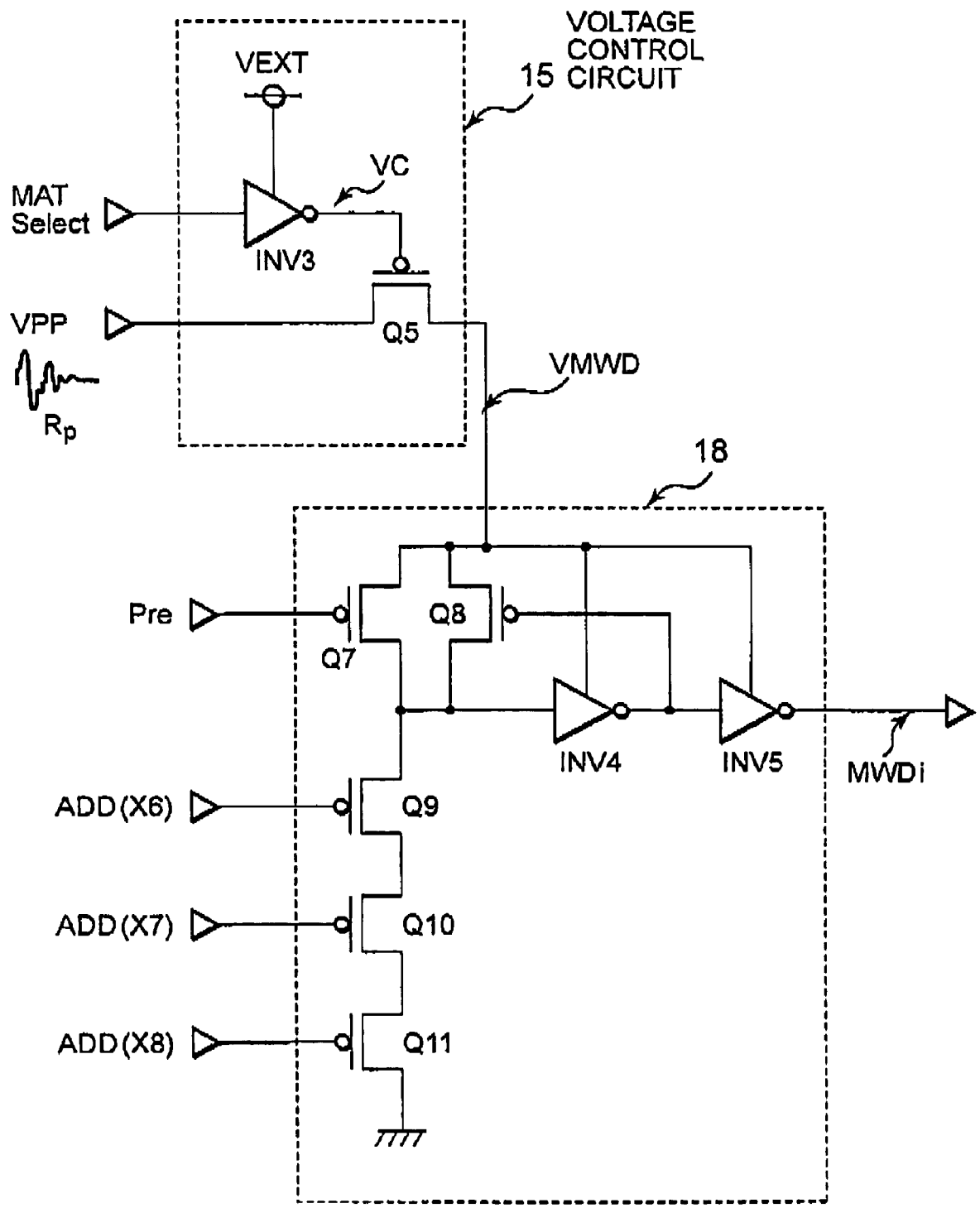
FIG. 9 is a diagram illustrating a voltage control circuit and a main word decoder circuit according to the third embodiment.

A third embodiment of the present invention will be described with reference to FIGS. 8 and 9. In the third embodiment, the voltage control circuit according to the present invention is applied to a main word decoder circuit of a semiconductor storage device. FIG. 8 is a schematic diagram for explaining word line selection in a memory cell array mat (hereafter, abbreviated as MAT) according to the third embodiment of the present invention, and FIG. 9 shows a voltage control circuit and a main word decoder circuit.

As a result of the increased capacity of recent semiconductor storage devices, a memory cell array arranged in such semiconductor storage device is divided into a large number of blocks. For example, the memory cell array is divided into independently interleaving banks (hereafter, referred to as BANKs), and each BANK is divided into MATs. Each MAT is further divided into memory cell array blocks. The term "MAT" as used herein denotes a memory cell array having sense amplifiers in its region being activated simultaneously and containing memory cells selected by word lines and bit lines.

FIG. 8 shows one MAT 16. The MAT 16 is composed of n rows and m columns of memory cell array blocks 17, and each memory cell array block 17 is provided with a sub-word decoder circuit. The semiconductor storage device according to the third embodiment is designed to select a word line by a main word decoder circuit and a sub-word decoder circuit.

The MAT 16 shown in FIG. 8 includes n rows and m columns of memory cell array blocks 17. In each block 17, a word line is selected by a sub-word decoder circuit SWDC. A memory cell connected to an activated word line receives and transmits data through a bit line. In FIG. 8, only the components relating to the word lines are shown whereas components relating to bit lines and sense amplifiers are not shown, for the sake of simplicity of description. A word line is selected by an inverter circuit having a main word line MWDi from a main word decoder circuit MWDC as an input thereto and a sub-word drive signal SWDRk from a sub-word drive circuit SWDC as power supply. This activates a memory cell connected to the selected word line in the memory cell array block 17.

For example, the i-th main word line MWDi is selected and becomes a low level. Thus, the SWDR 6 is selected as the sub-word drive signal and becomes a high level, whereby a word line 16 from the inverter circuit INV hatched in the figure is selected and activated to a high level. The other word lines which are not selected remain at a low level. The main word line MWDi is at a high level when not selected and not accessed, and becomes a low level when selected. A sub-word drive signal SWDRk is at a low level when not selected and not accessed, and becomes a high level when selected. The main word line MWDi is rendered a high level when not selected and not accessed for the reason of fixing the word line at a low level and preventing the word line voltage from floating up due to peripheral noises. However, this may involve a risk that the boost voltage VPP is applied to many transistors to cause breakdown.

FIG. 9 shows a voltage control circuit 15 according to the present invention, and a main word decoder circuit 18 to which a boost voltage VPP having different current drive capabilities is applied. The main word decoder circuit 18 is composed of inverter circuits INV4 and INV5, and transistors Q7, Q8, Q9, Q10, and Q11. The power supply voltage is applied from the voltage control circuit 15 as a main word decoder voltage VMWD. The decoder circuit is an NAND circuit, and has the transistors Q9, Q10, and Q11 connected in series and receiving address signals ADD (X6, X7, and X8 in FIG. 9) at their gates. The drain of the transistor Q9 is used as a decoder node. The decoder node is connected to the drains of the transistors Q7 and Q8 and the input of the inverter circuit INV4. A precharge signal Pre and the output of the inverter circuit INV4 are respectively connected to the gates of the transistors Q7 and Q8 connected between the main word decoder voltage VMWD and the decoder node. The inverter circuit INV5 receives an output of the inverter circuit INV4 and outputs an output MWDi of the main word decoder circuit 18.

The circuit configuration of the voltage control circuit 15 is the same as the voltage control circuit 14 shown in FIG. 6, except that the input signal to the inverter circuit INV3 is changed to an MAT selection signal MAT-Select and the output voltage is changed to the main word decoder voltage VMWD.

When the MAT selection signal MAT-Select is at a low level, the power supply voltage VEXT is input to the gate of the transistor Q5 with the voltage control signal VC rendered a high level. When the gate voltage is the power supply voltage VEXT, the transistor Q5 connects the boost voltage VPP as the power supply voltage to the main word decoder circuit 18 in the state where the current drive capability of the boost voltage VPP is small.

When the MAT selection signal MAT-Select is at a high level, a low-level voltage control signal VC is input to the gate of the transistor 05. When the gate voltage is at a low level, the transistor Q5 connects the boost voltage VPP as the power supply voltage to the main word decoder circuit 18 in the state where the current drive capacity of the boost voltage VPP is large.

As described above, the magnitude of the current drive capability of the boost voltage applied to the main word decoder circuit 18 is switched according to the level of the MAT selection signal MAT-Select. This provides the same effect as the connection in the high or low impedance state in the second embodiment.

Only one voltage control circuit 15 is provided for a plurality of main word decoder circuits 18. In the third embodiment, one voltage control circuit 15 is provided for each MAT, because since an MAT is selected or not selected by the MAT selection signal MAT-SELECT to switch the magnitude of the current drive capability of the boost voltage VPP. However, the unit for which the voltage control circuit 15 is provided is not limited particularly, and can be set arbitrarily by means of a switching signal. In this example, the MAT selection signal MAT-Select for selecting a sense amplifier region to be activated is used for this purpose.

A description will be made of operation of the voltage control circuit 15 and the main word decoder circuit 18.

When the semiconductor storage device is not accessed, the MAT selection signal MAT-Select is not selected and at a low level. Although the transistor Q5 is in a conductive state, its gate level is the power supply voltage VEXT and its current drive capability is small. Accordingly, the boost voltage VPP is applied as the main word decoder voltage VMWD, but this is applied via the transistor Q5 having a small current drive capability. The precharge signal Pre and the address signal ADD are both at a low level, and the transistors Q7 and Q8 are conductive, while the transistors Q9, Q10, and 011 are non-conductive. The decoder node is thus precharged to a high level. In this case, the main word decoder output signal MWDi becomes a high level, and the boost voltage VPP is output.

When the semiconductor storage device is accessed but the MAT is not selected, the MAT selection signal MAT-Select is not selected and at a low level. Therefore, the boost voltage VPP is applied with a small current drive capability as the main word decoder voltage VMWD. At this time, the precharge signal Pre is at a high level, and the address signal ADD is at a low level. Since the address signal ADD Is at a low level, the transistors Q9, Q10, and Q11 remain non-conductive, and the decoder node holds the precharged high level. The precharge signal Pre becomes a high level and the transistor Q7 becomes non-conductive. However, since the decoder node holds the high level, the transistor Q8 remains conductive and thus the decoder node holds the high level. Accordingly, the main word decoder output signal MWDi becomes a high level, and the boost voltage VPP is output. Therefore, as shown in FIG. 8, if the sub-word drive signal SWDR is selected and becomes the boost voltage VPP, all the word lines in the non-selected MAT becomes the non-selected state since the main word decoder output signal MWDi is at a high level.

When the semiconductor storage device is accessed and the MAT is selected, the MAT selection signal MAT-Select becomes a high level. In this case, the transistor Q5 is conductive and the boost voltage VPP with a large current drive capability is output as the main word decoder voltage VMWD. Further, in this case, the operation differs depending on whether the main word decoder circuit 18 is selected or non-selected according to the address signals ADD (X6, X7, and X8).

In the first place, a description will be made of a case where the main word decoder circuit 18 is selected. In this case, the precharge signal Pre is at a high level, and all the address signals ADD (X6, X7, and X8) are at a high level. Since the address signals ADD are at a high level, the transistors Q9, Q10, and Q11 become conductive and the decoder node is discharged from the precharged high level to a low level. Accordingly, the transistor Q8 also becomes non-conductive, and the main word decoder output signal MWDi outputs a low level. Accordingly, in FIG. 8, the word line located at the intersection with the sub-word drive signal SWDR that is the selected boost voltage VPP is selected. The word line whose sub-word drive signal SWDR is not selected becomes the non-selected state.

Next, a description will be made of a case where the main word decoder circuit 15 is not selected. In this case, the precharge signal Pre is at a high level, and at least one of the address signals ADD (X6, X7, and X8) is at a low level. Since at least one or more of the address signals ADD (X6, X7, and X8) is at a low level, one or more of the transistors Q9, Q10, and Q11 is non-conductive, and the decoder node holds the precharged high level. The precharge signal Pre is at a high level and the transistor Q7 becomes non-conductive, However, since the decoder node holds the high level, the transistor Q8 becomes conductive, and the decoder node holds the high level. Therefore, the main word decoder output signal MWDi becomes a high level and the boost voltage VPP is output. Accordingly, in FIG. 8, even if the sub-word drive signal SWDR is selected to become the boost voltage VPP, all the word lines receiving the main word decoder output signal MWDi are in the non-selected state since the main word decoder output signal MWDi is at a high level.

According to the present embodiment, when the semiconductor storage device is not accessed and when the relevant MAT is not selected, a boost voltage VPP with a small current drive capability is applied as the main word decoder voltage VMWD. In this case, the boost voltage VPP is output as the output of the main word decoder circuit 18. A boost voltage VPP with a large current drive capability is applied as the main word decoder voltage VMWD only when the relevant MAT is selected. When the main word decoder circuit 18 in the selected MAT is selected, the boost voltage at the decoder node thereof is discharged and changed to a low-level output. In contrast, when the main word decoder circuit 18 is not selected, the boost voltage is continuously held in the charged state and the boost voltage is output.

As described above, when the semiconductor storage device is not accessed and the relevant MAT is not selected, a boost voltage with a small current drive capability is applied with the transistor Q5 being in the high impedance state. Although the number of elements applied with the boost voltage is the same, the transistor Q5 having high impedance functions as a low-pass filter, which reduces the influence of a ripple in the boost voltage. This largely reduces the risk that the transistors are broken down by the ripple in the boost voltage, whereby a highly reliable semiconductor storage device can be obtained. Although the present invention is applied to the main word decoder circuit in the present embodiment, it is obvious that it is also applicable to the sub-word drive circuit.

Although several preferred embodiments of the present invention have been described in detail, the present invention is not limited to these embodiments and various modifications may be made therein. For example, also in the second embodiment, a plurality of decoder circuits and level conversion circuits may be combined into groups. Thus, the combination thereof is not limited to this and any desired combination is applicable. It will be obvious that various changes and modifications may be made without departing from the scope of the present invention, and all such changes and modifications fall within the scope of the present invention.

What is claimed is:

1. A voltage control circuit connected to a combination of a decoder circuit and a level conversion circuit connected to the decoder circuit, the voltage control circuit comprising:
    a level conversion circuit voltage line applying a voltage to the level conversion circuit; and
    a boost voltage connection switching circuit switching a voltage applied to the level conversion circuit voltage line according to an output signal from the decoder circuit,
    wherein:
    a plurality of sets of the combination of the decoder circuit and the level conversion circuit are prepared; and
    the plurality of sets of the combination are divided into groups, each composed of a plurality of the decoder circuits and a plurality of the level conversion circuits, the voltage control circuit being provided for each of the groups, the level conversion circuit voltage line being connected in common to the plurality of level conversion circuits, the voltage control circuit further comprising a logic circuit, the logic circuit receiving outputs from the plurality of decoder circuits, and the voltage applied to the plurality of level conversion circuit being switched by inputting an output of the logic circuit to the boost voltage connection switching circuit.

2. The voltage control circuit according to claim 1, wherein the logic circuit is an NOR circuit.

3. The voltage control circuit according to claim 2, further comprising hold voltage connection switching circuit applying a power supply voltage lower than the boost voltage to the level conversion circuit voltage line when the NOR circuit outputs a high level.

4. A semiconductor circuit comprising:
    a decoder circuit receiving a signal to be decoded and outputting a decoded signal, the decoded signal taking one of a selected level and a non-selected level;
    a level conversion circuit coupled to receive the decoded signal from the decoder circuit, the level conversion circuit comprising a voltage line to convert the selected level of the decoded signal to a voltage of the voltage line; and
    a voltage control circuit coupled to receive the decoded signal from the decoder circuit, the voltage control circuit being further coupled to the voltage line of the level conversion circuit to supply the voltage line of the level conversion circuit with a first voltage when the decoded signal takes the non-selected level and with a second voltage, which is higher than the first voltage, regardless of a level of the first voltage when the decoded signal takes the selected level.

5. The semiconductor circuit as claimed in claim 4, wherein the voltage control circuit includes a first node supplied with the second voltage and a first switching circuit connected between the first node and the voltage line of the level conversion circuit, the first switching circuit being turned ON when the decoded signal takes the selected level to supply the first voltage from the first node to the voltage line and turned OFF when the decoded signal takes the non-selected level to disconnect the first node from the voltage line.

6. The semiconductor circuit as claimed in claim 5, wherein the voltage control circuit further includes a second node supplied with the first voltage and a second switching circuit connected between the second node and the voltage line, the second switching circuit being turned ON when the decoded signal takes the non-selected level to supply the first voltage from the second node to the voltage line and turned OFF when the decoded signal takes the non-selected level to disconnect the second node from the voltage line.

7. The semiconductor circuit as claimed in claim 6, wherein the voltage control circuit further includes an inverter circuit operating on the second voltage and having an input end supplied with the decoded signal and an output end, the first switching circuit including a first transistor of a first conductivity type, the second switching circuit including a second transistor of a second conductivity type, the output end of the inverter circuit being electrically connected to gates of the first and second transistors.

8. A semiconductor circuit comprising:
    a plurality of decoder circuits each supplied with a set of signals to be decoded and outputting a decoded signal which takes one of a selected level and a non-selected level,
    a plurality of level conversion circuits each provided for an associated one of the decoder circuits to receive the decoded signal therefrom, each of the level conversion circuits including a voltage node and converting the selected level of an associated decoded signal to a voltage at the voltage node, and
    a voltage control circuit including a voltage output node coupled in common to the output nodes of the level conversion circuits, the voltage control circuit receiving the decoded signals from the decoder circuits and producing at the voltage output node a first voltage when each of the decoded signals takes the non-selected level and a second voltage, which is higher than the first voltage, whenever any one of the decoded signals takes the selected level.

9. The semiconductor circuit as claimed in claim 8, further comprising a set of address terminals supplied with address information, the address information being supplied in common to the decoder circuits as the set of signals to be decoded.

10. The semiconductor circuit as claimed in claim 8, wherein the voltage control circuit further includes a first node supplied with the first voltage, a second node supplied with the second voltage, a first switch connected between the first node and the voltage output node, a second switch connected between the second node and the voltage output node, and a gate circuit receiving the decoded signals from the decoder circuits to turn the first and second switches ON and OFF, respectively, when each of the decoded signals takes the non-selected level and to turn the first and second switches OFF and ON, respectively, whenever any one of the decoded signals takes the selected level.

11. The semiconductor circuit as claimed in claim 10, wherein the gate circuit comprises an NOR gate circuit, the NOR gate circuit operating on the second voltage and output of the NOR gate circuit being electrically connected to a control electrode of each of the first and second switches.

* * * * *